United States Patent [19]

Wilson et al.

[11] Patent Number: 4,943,539

[45] Date of Patent: Jul. 24, 1990

[54] PROCESS FOR MAKING A MULTILAYER METALLIZATION STRUCTURE

[75] Inventors: Syd R. Wilson, Phoenix; James A. Sellers; Robert J. Mattox, both of Tempe, all of Ariz.

[73] Assignee: Motorola, Inc., Schaumburg, Ill.

[21] Appl. No.: 350,665

[22] Filed: May 9, 1989

[51] Int. Cl.$^5$ .............................................. H01L 21/90
[52] U.S. Cl. .................................... 437/195; 437/192; 437/228; 437/947
[58] Field of Search ............... 437/192, 195, 981, 947, 437/228, 189, 190, 200, 203, 225; 148/DIG. 51; 357/71; 156/644, 653, 656

[56] References Cited

U.S. PATENT DOCUMENTS

| | | | |
|---|---|---|---|
| 4,634,496 | 1/1987 | Mase et al. | 156/643 |
| 4,767,724 | 8/1988 | Kim et al. | 437/195 |
| 4,786,962 | 11/1988 | Koch | 357/71 |
| 4,824,803 | 4/1989 | Us et al. | 437/192 |
| 4,826,785 | 5/1989 | McClure et al. | 437/192 |
| 4,839,311 | 6/1989 | Riley et al. | 437/228 |

FOREIGN PATENT DOCUMENTS

| | | | |
|---|---|---|---|
| 0068035 | 4/1982 | Japan | 437/947 |
| 0114236 | 5/1988 | Japan | 437/192 |

OTHER PUBLICATIONS

May, et al, *J. Electrochem. Soc.*, vol. 135, No. 6, Jun. 1988, pp. 1592–1594.
Kang, et al., *J. Electronic Materials*, vol. 17, No. 3, 1988; pp. 213–216.
Green, M. L., "Applications of CVD W and CVD Al for ULSI Structures", Proceedings of the Electrochemical Society, Spring 1988, pp. 322–323.

*Primary Examiner*—Brian E. Hearn
*Assistant Examiner*—T. N. Quach
*Attorney, Agent, or Firm*—Joe E. Barbee; Stuart T. Langley

[57] ABSTRACT

A method for forming a via contact for devices having multilayer metallization is provided wherein a sacrificial layer is formed over a bottom interconnect layer, and an interlayer dielectric is formed on the sacrificial layer. A via is etched in the interlayer dielectric, exposing the sacrificial layer. The sacrificial layer is isotropically etched to expose an area of the interconnect metal that is larger than the area of the via and a via metallization is selectively formed on the interconnect metal by chemical vapor deposition so that the via, including a void created by the isotropic etch of the sacrificial layer, is filled with the via metallization, thereby providing a contact area to the bottom interconnect metal which is larger than the via metallization itself.

10 Claims, 2 Drawing Sheets

PROCESS FOR MAKING A MULTILAYER METALLIZATION STRUCTURE

BACKGROUND OF THE INVENTION

The present invention relates, in general, to contacts for semiconductor integrated circuits and, more particularly, to via contact structures for semiconductor devices having multilayer metallization.

As semiconductor device dimensions approach the submicron level, one of the limiting factors for further reduction in size is area required for device interconnections. One possible solution is multilevel metallization in which two or more interconnect layers are formed on top of a device, separated by an interlayer dielectric, and coupled by holes, or vias, which are filled with a via metallization. Even with multilayer metallization, though, the area required for vias limits further reduction in device size. Photolithography technology has advanced so that submicron via windows can be formed reliably, but due to contact resistance and metal step coverage issues, it has not been possible to take advantage of these advances.

A major contributor to the resistance of the via metallization is contact resistance at a bottom and a top interface area, also known as contact areas, between the via metallization and the interconnect layers. This interfacial contact resistance is inversely proportional to the cross sectional area of the contact. Effective via metallization must have sufficient contact area at both the bottom and top of the via to provide a low resistance contact. Due to alignment tolerances when a via pattern is aligned to an underlying interconnect pattern, the via pattern must be made smaller than the underlying metal interconnect pattern. In the past, vias were etched into the interlayer dielectric so that the bottom contact area was the same as, or smaller than, the top contact area. Since the contact resistance is inversely proportional to the interfacial area of the contact, the small area of the via pattern, and particularly the small bottom contact area, led to higher contact resistance.

Another contributor to contact resistance is contamination of the interface between the via metallization and the interconnect layer. Any impurities, such as oxides, organic compounds, or the like, which alter the surface of the underlying interconnect layer from its as-deposited condition, will increase contact resistance. In the past, a top surface of the underlying interconnect layer was contaminated by the process of etching the via, and it was difficult to clean the top surface so as to return the surface to its as-deposited condition. It is thus advantageous to protect the underlying interconnect layer during the via etch process.

Small vias also resulted in current crowding at the bottom contact area which caused localized heating, increased resistance and made the contact less reliable due to electromigration effects. Current crowding was known to occur at metal corners which formed at the interface between the interconnect layer and the via metallization, resulting in higher current density at the corners than in the body of the via metallization. Current crowding effects significantly reduced the lifetime and reliability of the via metallization. It is important to note that due to the localized nature of the current crowding effect, it was not the cross sectional area of the via metallization that effected reliability, but instead the interface areas at the top and bottom of the via.

Another problem with previous multilayer metallization processes was filling the via with the via metallization without creating voids so that a high quality electrical contact was formed. Conventional metal deposition methods such as evaporation, sputtering, and reactive ion sputtering have been used to fill vias. These metal deposition processes are generically called physical deposition processes. Physical deposition processes form a layer on all exposed surfaces except surfaces that are blocked by physical topography barriers such as corners. These metal deposition methods thus resulted in poor step coverage within the via, which was aggravated as the aspect ratio, that is the ratio of height to width of the via, increased. Poor step coverage forced manufacturers to slope the via walls, which improved step coverage and decreased the aspect ratio, but also increased the dimensions of the contact.

Chemical deposition techniques, and chemical vapor deposition (CVD) techniques in particular, have also been used to form metal layers on semiconductors. Chemically deposited layers are known to deposit conformably around corners and into spaces that physical deposition processes cannot fill. Recently, CVD techniques which form a selective metal layer have been used to form via metallization. The CVD process can selectively deposit a metal, such as tungsten, onto conductive surfaces, while not depositing on dielectric surfaces such as oxide or nitride. Because they conformably coat the conductive surfaces, selective CVD processes can provide contacts and vias with superior fill quality.

A limitation of the selective CVD process was that by-products of the CVD reaction could damage the underlying interconnect metallization. In particular, a fluorine by-product of CVD tungsten deposition will react with aluminum interconnect metal, forming a high resistance layer between the interconnect and via metallizations. Therefore, it is desirable to protect the interconnect metallization during the CVD process.

Usually, a dry etch process such as plasma etching or reactive ion etching is used to etch the interlayer dielectric. The dry etch process causes a polymer film to form on the sidewalls of the via. The polymer film flaked off during subsequent processing, creating defects in the device and lowering yield. As the interlayer dielectric is cleared from the interconnect metal, some of the interconnect metal backsputtered onto the sidewalls of the via and incorporated into the polymer film. In the past it was difficult to remove this polymer film without damaging the exposed interconnect metal. Since selective CVD metal deposited on conductive materials, this backsputtered metal acted as a nucleation surface for the CVD metal formation, causing undesirable sidewall metal deposition. Sidewall metal deposition resulted in voids in the via metallization, and lower reliability of the via contact.

Accordingly, it is an object of the present invention to provide a method for producing a contact structure with increased contact area at the base of the via.

It is another object of the present invention to provide a method for producing a contact structure with improved reliability.

It is another object of the present invention to provide a via structure with reduced via resistance.

It is a further object of the present invention to provide a method for producing a contact structure which does not degrade underlying interconnect metal layers.

It is a further object of the present invention to provide a contact structure which can be easily down sized.

It is a still further object of the present invention to provide a method for producing a contact structure with improved alignment tolerance.

SUMMARY OF THE INVENTION

The above and other objects and advantages of the present invention are achieved by providing a via metallization wherein a sacrificial layer is formed on a bottom interconnect metal, and an interlayer dielectric is formed on the sacrificial layer. A via is etched in the interlayer dielectric, exposing the sacrificial layer. The sacrificial layer is isotropically etched to expose an area of the interconnect metal that is larger than the area of the via. A via metallization is formed on the interconnect metal by a conformable deposition process so that the via, including a void created by the isotropic etch of the sacrificial layer, is filled with the via metallization thereby providing a contact area to the bottom interconnect metal which is larger than the via metallization itself.

DETAILED DESCRIPTION OF THE DRAWINGS

Figure 1:
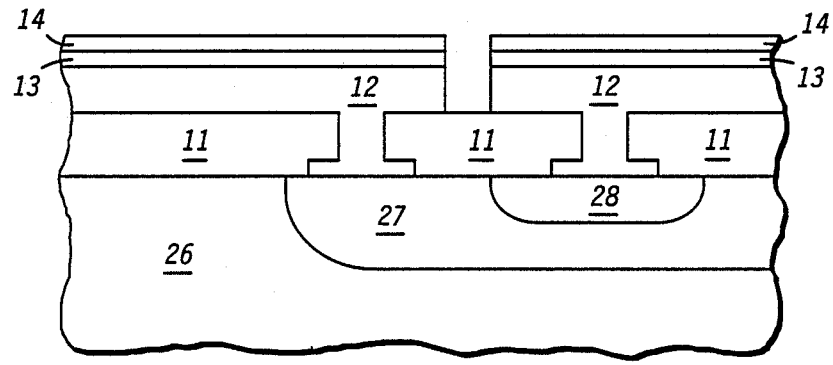
FIGS. 1-4 and 6 illustrate enlarged cross-sectional views of a multilayer metallization with a metal via at various stages of fabrication.

FIG. 1 illustrates an enlarged cross-sectional view of a via contact of a multilayer metal system processed through first metal deposition. This multilayer system is made on the surface of semiconductor substrate 26 to interconnect device elements, such as 27 and 28, of an integrated circuit device built in substrate 26. Interlayer dielectric 11 is formed covering device elements 27 and 28, and patterned to form contact windows, or vias, over portions of device elements 27 and 28. These contact windows, or vias, are filled with a via metallization using the method of the present invention, which will be described in greater detail hereinafter. Although the invention will be described in reference to formation of a via in a multilayer metal structure, it should be understood that the method can also provide a contact directly to device elements 27 and 28 formed in semiconductor substrate 26. First interconnect layer 12 is formed on dielectric 11 and covered by first metal layer 13 and sacrificial layer 14. Interconnect layer 12 must be of sufficient thickness and conductivity to carry the designed current density of the device. In a preferred embodiment, interconnect layer 12 comprises aluminum copper alloy (AlCu), first metal layer 13 comprises titanium tungsten alloy (TiW), and sacrificial layer 14 comprises aluminum alloy. The specific materials for each layer are chosen for chemical and electrical properties described hereinafter, and it should be noted that in some embodiments a single layer will serve the function of both interconnect layer 12 and first metal layer 13. First metal layer 13 must be formed of a material that will not etch in a process that will etch sacrificial layer 14. That is to say that first metal layer 13 is an etch stop for sacrificial layer 14. It should become apparent that sacrificial layer 14 can be selected from many common materials such as nitrides and organic compounds, and need not be a metal.

When the via is formed to make contact to device elements 27 and 28 which are formed on a semiconductor substrate, first metal layer 13 preferably comprises titanium silicon (TiSi) and sacrificial layer 14 comprises titanium nitride (TiN).

Figure 2:
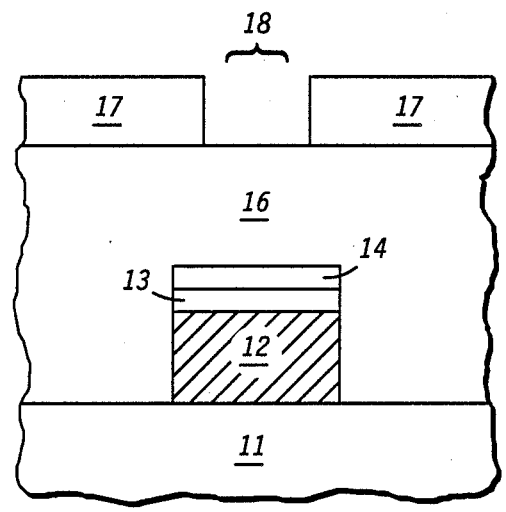

FIG. 2 illustrates an enlarged view of an upper portion of the via contact structure shown in FIG. 1 after first interconnect layer 12, first metal layer 13 and sacrificial layer 14 have been patterned with an interconnect pattern using conventional photoresist methods. Interlayer dielectric 16 is formed over the patterned layers, and photoresist film 17 is formed and patterned on interlayer dielectric 16. Via window 18 in photoresist film 17 defines the cross sectional area of the via, and must be made smaller than the area of the underlying interconnect pattern to compensate for alignment errors.

Figure 3:
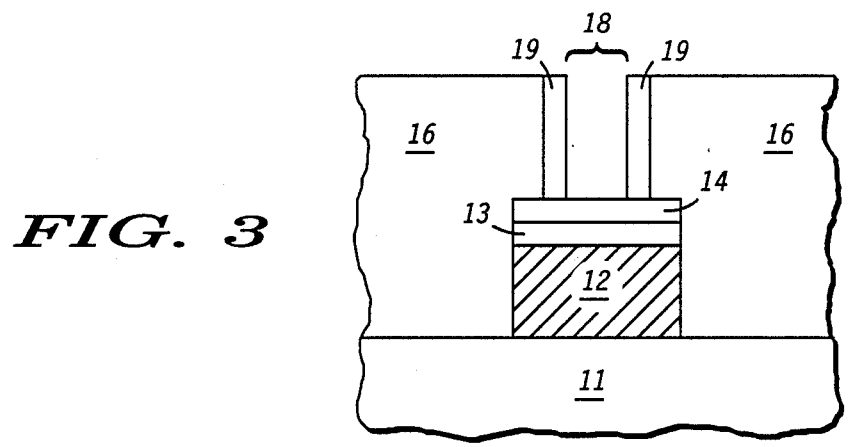

FIG. 3 illustrates the via contact structure after a via is etched in interlayer dielectric 16 using photoresist film 17 shown in FIG. 2 as a mask. Interlayer dielectric 16 is usually etched with a dry etch process, producing nearly vertical sidewalls. Vertical sidewalls are desirable as they limit lateral encroachment of the via, and thus produce smaller devices. A portion of sacrificial layer 14 is thus exposed at the bottom of the via. During the interlayer dielectric etch, polymer film 19 may be formed on sidewalls of the via. Polymer film 19 is highly irregular in composition, and comprises material from sacrificial layer 14 that is backsputtered onto the sidewalls as well as by-products of the dry etch process. Photoresist film 17 and organic components of polymer film 19 are removed by conventional methods, such as a plasma ash, but inorganic components of polymer film 19 are not removed by these methods.

Figure 4:
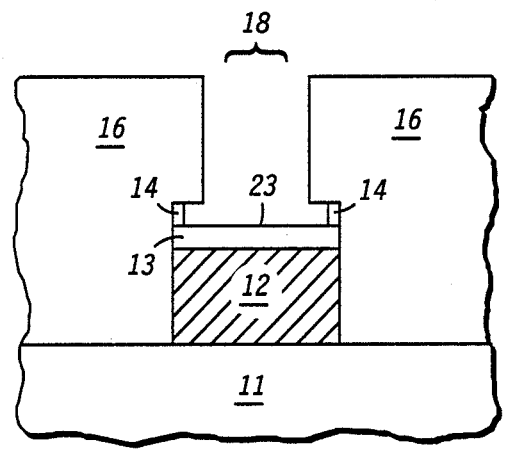
Figure 5:
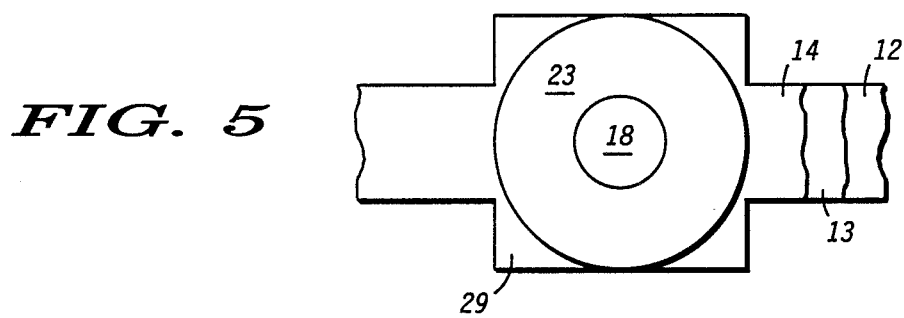
FIG. 5 illustrates a plan view of a multilayer metallization structure.

Sacrificial layer 14 is isotropically etched as illustrated in FIG. 4, removing material underneath dielectric layer 16. Preferably a wet chemical etch comprising nitric acid, phosphoric acid and acetic acid is used for the isotropic etch. The isotropic etch creates an inverted "T" shaped void, exposing an area of first metal 13 that is larger than the area of via window 18. The isotropic etch of sacrificial layer 14 can be controlled so that a large area of sacrificial layer 14 is laterally removed, thereby forming contact area 23 at the base of the via that is as large as the width of the interconnect pattern, as illustrated in FIG. 5. Although it is convenient to form sacrificial layer 14 of a metal, it may comprise any material that is compatible with the deposition and etching of interlayer dielectric 16 as described hereinbefore, and which can be substantially removed during the isotropic etch process without affecting interlayer dielectric 16 or first metal layer 13. The isotropic etch also removes residual backsputtered material that may have been incorporated in polymer film 19, particularly the inorganic components which remain after the conventional photoresist cleaning process. First metal layer 13 serves as an etch stop for the isotropic etch, as described hereinbefore, and protects interconnect layer 12 layer 12 from damage during the isotropic etch. Sacrificial layer 14 also serves to protect first metal layer 13 during the etch of interlayer dielectric 16 so that the surface of first metal layer 13 which is exposed is substantially the as-deposited surface, free of oxides and contamination. The quality of a subsequent metal formed on top of first metal layer 13 is highly dependent on the cleanliness of the surface, and so this protection function of sacrificial layer 14 is highly valuable.

FIG. 5 illustrates a plan view of the via contact structure. First interconnect layer, with overlying first metal layer 13 and sacrificial layer 14, are patterned to form landing pad 29 underneath via window 18. Interlayer dielectric 16 (not shown) covers the entire surface. Ideally, via window 18 is centered in landing pad 29. The difference between the diameter of via window 18 and the width of landing pad 29 represents the alignment tolerance of a photolithography process used. Via window 18 extends into interlayer dielectric 16, as described hereinbefore, and contact area 23 is formed by removal of sacrificial layer 14. It can be seen that contact area 23 is significantly larger than via window 18, and that because contact area 23 is formed by an etch process, the area can be increased by etching away more of sacrificial layer 14. It should be noted that an alignment error when via window 18 is formed will not change the size of contact area 23 and that a severe alignment error can be compensated for by etching away more of sacrificial layer 14.

Figure 6:
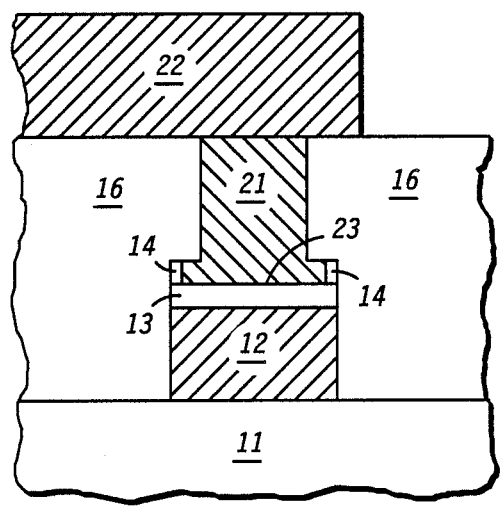

FIG. 6 illustrates the via contact structure after the via is filled with via metallization 21. Via metal 21 is selectively formed on the exposed area of first metal layer 13. In a preferred embodiment, via metal 21 is formed by chemical vapor deposition (CVD) of tungsten (W) using tungsten hexafluoride ($WF_6$) reduced in a hydrogen environment. Other CVD metal deposition processes are known and may be used by selecting compatible materials for first metal layer 13 and sacrificial layer 14. Also, via metallization 21 may be formed by any chemical deposition processes such as electroless metal plating. First metal layer 13 serves to protect interconnect 12 from by-products of the CVD process, such as fluorine when $WF_6$ gas is used. The CVD metallization process fills the inverted "T" shaped void, thus forming contact area 23 between via metal 21 and first metal layer 13. Second interconnect layer 22 is formed in contact with via metallization and patterned using conventional photoresist techniques.

In another embodiment via metal 21 is formed to overfill the via so that a mushroom shaped cap (not shown) is formed on top of dielectric layer 16. This structure increases the interface area between via metallization 21 and second interconnect layer 22, thus further improving the resistance of the via. Other techniques for increasing the interface area at the top of the via by etching interlayer dielectric 16 are well known in the art, and also are effective at lowering via resistance.

By now it should be appreciated that a method for producing a multilayer metal device with an improved via contact structure has been provided, wherein the contact area at the base of the via can be made as large as the area of the underlying interconnect layer. The increased contact area results from the use of a sacrificial layer which is removed and replaced by a selectively deposited via metallization. Because the contact area at the base of the via is formed by removing the sacrificial layer, the alignment tolerance of the via contact window to the underlying interconnect layer is dramatically improved. The larger contact area lowers the resistance of the via contact and lowers the current density in the via contact area, thus improving reliability of the contact.

We claim:

1. A method for increasing contact area of a via metallization formed between metal interconnect layers of a multi-layer metallization comprising the steps of: providing a first metal layer; forming a sacrificial layer on the first metal layer, wherein the first metal layer serves as an etch stop for the sacrificial layer; forming an interlayer dielectric covering the sacrificial layer; etching a via in the interlayer dielectric; isotropically etching the sacrificial layer to expose an area of the first metal layer so that the exposed area of the first metal layer is larger than the area of the via; forming the via metallization on the exposed first metal layer filling the via and a void created by the isotropic etching of the sacrificial layer.

2. The method of claim 1 wherein the first metal layer comprises TiW and the sacrificial layer comprises a metal.

3. The method of claim 1 wherein the first metal layer comprises TiSi and the sacrificial layer comprises TiN.

4. The method of claim 1 wherein the via metallization is formed by chemical vapor deposition.

5. The method of claim 1 wherein the via metallization is formed by electroless metal plating.

6. The method of claim 4 wherein the via metallization comprises W formed by decomposition of $WF_6$ gas.

7. The method of claim 4 wherein the via metallization comprises Al.

8. The method of claim 1 wherein the step of forming the via metallization further comprises overfilling the via so that a portion of the via metallization extends outside of the via and provides a larger surface area than the cross sectional area of the via.

9. The method of claim 6 wherein the sacrificial metal layer protects the first metal layer from damage caused by the via etch process and the first metal layer protects an underlying interconnect layer from damage caused by a fluorine by-product of the decomposition of $WF_6$ gas.

10. A method for forming a via in an interlayer dielectric over an interconnect layer of a multilayer metal system, comprising the steps of: forming a sacrificial layer over a portion of the interconnect layer, wherein the sacrificial layer does not extend beyond the interconnect layer; forming the interlayer dielectric covering the interconnect layer and the sacrificial layer; etching the interlayer dielectric so as to expose a portion of the sacrificial layer and form a top portion of the via; and isotropically etching the sacrificial layer to form a bottom portion of the via, wherein the interlayer dielectric is significantly undercut during the step of isotropic etching the sacrificial layer so that the bottom portion of the via is larger than the top portion of the via.

* * * * *